United States Patent
Northrup et al.

(10) Patent No.: US 9,112,331 B2
(45) Date of Patent: Aug. 18, 2015

(54) SURFACE EMITTING LASER INCORPORATING THIRD REFLECTOR

(75) Inventors: John E. Northrup, Palo Alto, CA (US);
Thomas Wunderer, Palo Alto, CA (US);
Noble M. Johnson, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 115 days.

(21) Appl. No.: 13/427,105

(22) Filed: Mar. 22, 2012

(65) Prior Publication Data
US 2013/0343420 A1    Dec. 26, 2013

(51) Int. Cl.
| | |
|---|---|
| H01S 5/00 | (2006.01) |
| H01S 3/09 | (2006.01) |
| H01S 3/091 | (2006.01) |
| H01S 3/08 | (2006.01) |
| H01S 5/183 | (2006.01) |

(Continued)

(52) U.S. Cl.
CPC ............ *H01S 5/18366* (2013.01); *B82Y 20/00* (2013.01); *H01S 5/141* (2013.01); *H01S 5/18383* (2013.01); *H01S 5/34333* (2013.01); *H01S 3/109* (2013.01); *H01S 5/041* (2013.01); *H01S 5/18361* (2013.01); *H01S 5/18369* (2013.01); *H01S 5/18377* (2013.01); *H01S 5/3201* (2013.01)

(58) Field of Classification Search
CPC ............ H01S 3/0815–3/0817; H01S 5/18363; H01S 5/18316; H01S 5/1025
USPC ....................................... 372/50.11
See application file for complete search history.

(56) References Cited

U.S. PATENT DOCUMENTS

| | | |
|---|---|---|
| 4,730,334 A | 3/1988 | Collins et al. |
| 5,461,637 A | 10/1995 | Mooradian et al. |

(Continued)

FOREIGN PATENT DOCUMENTS

| | | |
|---|---|---|
| EP | 1208622 | 5/2003 |
| EP | 1720225 | 11/2006 |

(Continued)

OTHER PUBLICATIONS

"Thin-film interference", http://en.wikipedia.org/wiki/Thin-film_interference.*
Design considerations of GaN VCSELs, https://sites.google.com/site/timtclu/ganvcselii.*
Amari, "Characterization of thickness, elemental distribution andband-gap properties in AlGaN/GaN quantum wells by aberration-corrected TEM/STEM", Electron Microscopy and Analysis Group Conference 2011.*

(Continued)

*Primary Examiner* — Xinning Niu
*Assistant Examiner* — Vu A Vu
(74) *Attorney, Agent, or Firm* — Hollingsworth Davis, LLC

(57) ABSTRACT

Surface emitting laser structures that include a partially reflecting element disposed in the laser optical cavity are disclosed. A vertical external cavity surface emitting laser (VECSEL) structure includes a pump source configured to emit radiation at a pump wavelength, $\lambda_{pump}$, an external out-coupling reflector, a distributed Bragg reflector (DBR,) and an active region arranged between the DBR and the out-coupling reflector. The active region is configured to emit radiation at a lasing wavelength, $\lambda_{lase}$. The VECSEL structure also includes partially reflecting element (PRE) arranged between the gain element and the external out-coupling reflector. The PRE has reflectivity of between about 30% and about 70% for the radiation at the lasing wavelength and reflectivity of between about 30% and about 70% for the radiation at the pump wavelength.

19 Claims, 13 Drawing Sheets

(51) Int. Cl.
  *H01S 5/14* (2006.01)
  *H01S 5/343* (2006.01)
  *B82Y 20/00* (2011.01)
  *H01S 3/109* (2006.01)
  *H01S 5/04* (2006.01)
  *H01S 5/32* (2006.01)

(56) References Cited

U.S. PATENT DOCUMENTS

| | | | |
|---|---|---|---|
| 5,561,680 A * | 10/1996 | Haberern et al. | 372/46.01 |
| 5,677,923 A | 10/1997 | Rice et al. | |
| 5,706,306 A | 1/1998 | Jiang et al. | |
| 5,771,253 A | 6/1998 | Chang-Hasnain et al. | |
| 6,393,038 B1 | 5/2002 | Raymond et al. | |
| 6,556,602 B2 | 4/2003 | Rice et al. | |
| 6,611,544 B1 | 8/2003 | Jiang et al. | |
| 6,611,546 B1 * | 8/2003 | Garnache et al. | 372/92 |
| 6,735,234 B1 * | 5/2004 | Paschotta et al. | 372/75 |
| 6,775,314 B1 * | 8/2004 | Waldrip et al. | 372/96 |
| 6,778,582 B1 * | 8/2004 | Mooradian | 372/97 |
| 6,879,618 B2 | 4/2005 | Cok et al. | |
| 6,882,669 B2 | 4/2005 | Hang et al. | |
| 7,167,495 B2 * | 1/2007 | Johnson | 372/43.01 |
| 7,471,854 B2 | 12/2008 | Cho et al. | |
| 7,573,920 B2 | 8/2009 | Lee et al. | |
| 7,590,161 B1 | 9/2009 | Hug et al. | |
| 7,613,215 B2 * | 11/2009 | Kim | 372/22 |
| 7,733,936 B2 * | 6/2010 | Okamoto | 372/50.124 |
| 7,856,043 B2 * | 12/2010 | Kim et al. | 372/50.124 |
| 8,000,371 B2 | 8/2011 | Strittmatter et al. | |
| 8,102,893 B2 | 1/2012 | Giaretta et al. | |
| 8,121,169 B2 | 2/2012 | Nguyen et al. | |
| 2003/0031218 A1 | 2/2003 | Yeh | |
| 2003/0081642 A1 | 5/2003 | Hwang et al. | |
| 2003/0214992 A1 | 11/2003 | Lester et al. | |
| 2004/0013154 A1 * | 1/2004 | Zheng | 372/96 |
| 2004/0233961 A1 | 11/2004 | Lutgen | |
| 2005/0100074 A1 | 5/2005 | Okazaki et al. | |
| 2005/0135450 A1 | 6/2005 | Katsuyama et al. | |
| 2005/0232327 A1 * | 10/2005 | Nomura et al. | 372/50.12 |
| 2005/0281309 A1 | 12/2005 | Kim | |
| 2006/0029112 A1 | 2/2006 | Young et al. | |
| 2006/0029120 A1 * | 2/2006 | Mooradian et al. | 372/102 |
| 2006/0140235 A1 | 6/2006 | Kim | |
| 2007/0009000 A1 * | 1/2007 | Tanaka et al. | 372/45.01 |
| 2007/0189350 A1 * | 8/2007 | Young et al. | 372/50.124 |
| 2007/0274361 A1 | 11/2007 | Calvez et al. | |
| 2008/0031289 A1 * | 2/2008 | Cho et al. | 372/22 |
| 2008/0112443 A1 | 5/2008 | Lee et al. | |
| 2008/0117946 A1 | 5/2008 | Kim | |
| 2008/0192784 A1 * | 8/2008 | Brick | 372/34 |
| 2009/0207873 A1 * | 8/2009 | Jansen | 372/50.12 |
| 2009/0232179 A1 | 9/2009 | Ikuta | |
| 2009/0296752 A1 | 12/2009 | Giaretta et al. | |
| 2010/0150193 A1 * | 6/2010 | Bhat et al. | 372/44.01 |
| 2011/0182312 A1 | 7/2011 | Chen et al. | |
| 2011/0216789 A1 | 9/2011 | Docter et al. | |
| 2011/0268143 A1 * | 11/2011 | Strittmatter et al. | 372/36 |
| 2013/0163627 A1 | 6/2013 | Seurin et al. | |

FOREIGN PATENT DOCUMENTS

| | | |
|---|---|---|
| EP | 1648060 | 7/2008 |
| WO | WO03007437 | 1/2003 |
| WO | WO2006074011 | 7/2006 |
| WO | WO2007144471 | 12/2007 |
| WO | WO2009060365 | 5/2009 |

OTHER PUBLICATIONS

Fedler et al., "High Reflectivity AlGaN/AlN DBR Mirrors Grown by PA-MBE", Phys. Stat. Sol. (c) ), No. 1, 2002, pp. 258-262.

Gronin et al., "Effective Green Semiconductor Lasers with Multiple CdSe/ZnSe QD Active Region for Electron Beam Pumping", Acta Physica Polonica A vol. 114, No. 5, 2008, 8 pages.

Kozlovsky et al., "E-beam Longitudinally Pumped Laser Based on ZnCdSe/ZnSe MQW Structure Grown by MBE on ZnSe(001) Substrate", Phys. Stat. Sol. (b), vol. 229, No. 2, 2002, pp. 1033-1038.

Kozlovsky et al., "E-beam Longitudinally Pumped Laser on MOVPE-Grown Hexagonal CdSSe/CdS MQW Structure", $10^{th}$ European Workshop on MOVPE, Lecce, Italy Jun. 8-11, 2003, 4 pages.

Kozlovsky et al., "E-beam Pumped Blue-Green VCSEL Based on ZnCdSe/ZnSe MQW Structure Grown by MBE on ZnSe Substrate", Laser Physics, vol. 8, No. 6, 1998, pp. 1118-1123.

Kozlovsky et al., "Electron-beam Pumped Laser Structures based on MBE Grown ZnCdSe/ZnSe Superlattices", Journal of Crystal Growth, vol. 159, 1996 pp. 609-612.

Krestinokov, "Photopumped InGaN/GaN/AlGaN Vertical Cavity Surface Emitting Laser Operating at Room Temperature", Phys. Stat. sol. (b) 216, 1999 pp. 511-515.

Rao et al., "Multiwavelength HCG-VCSEL Array", IEEE, 2010, pp. 11-12.

Skrobol et al., "A Miniature Electron Beam Pumped Laser", The European Physical Journal D, vol. 54, 2009, pp. 103-109.

Tiberi et al., "Electron Beam Pumped Lasers Based on II-VI Compound Nanostructures from the Visible to UVA", Phys. Status Solidi, vol. 247, No. 6, 2010, pp. 1547-1552.

Vysotsky et al., "Simulation of a Longitudinally Electron-beam-pumped Nanheterostructure Semiconductor Laser", Quantum Electronics, vol. 39, No. 11, 2009, pp. 1028-1032.

Wunderer et al., "In-Well Pumping of InGaN/GaN Vertical-External-Cavity Surface-Emitting Lasers", Appl. Phys. Lett. 99, 201109 (2011), 4 pages.

Yu et al., "Electron-beam Pumped Blue (462nm) VCSEL on MOVPE-grown ZnSSe/ZnMgSSe MQW Structure", Phys. Stat. Sol. (c) vol. 2, No. 2, 2005, pp. 935-938.

Zverev et al. "Low-threshold Electron-beam-pumped Green Quantum-well Heterostructure Semiconductor Lasers", Quantum Electronics, vol. 34, No. 10, 2004, pp. 909-911.

Amari et al., "Characterization of thickness, elemental distribution and band-gap properties in AlGaN/GaN quantum wells by aberration-corrected TEM/STEM" Journal of Physics: Conference Series 371, 2012, 4 pages.

File History for U.S. Appl. No. 13/427,105.

Search Report dated Jun. 28, 2013 from GB Application No. GB1305193.3, 4 pages.

Search Report dated Jun. 21, 2013 from GB Application No. GB1305179.2, 4 pages.

File History for U.S. Appl. No. 13/427,335.

File History for U.S. Appl. No. 13/523,681.

Kuznetsov et al., "Design and Characteristics of High-Power (>0.5-W CW) Diode-Pumped Vertical-External-Cavity Surface-Emitting Semiconductor Lasers withCurcutlar $TEM_{00}$ Beams", IEEE Journal of Selected Topics in Quantum Electronics, vol. 5, No. 3, May/Jun. 1999, pp. 561-573.

Lee et al., "7W High-Efficiency Continuous-Wave Green Light Generation by Intracavity Frequency Doubling of an End-Pumped Vertical External-Cavity Surface Emitting Semiconductor Laser", Applied Physics Letters, 89, 241107, 2006, 6 pages.

* cited by examiner

SURFACE EMITTING LASER INCORPORATING THIRD REFLECTOR

STATEMENT REGARDING FEDERALLY SPONSORED RESEARCH AND DEVELOPMENT

This invention was made with Government support under U.S. Army Cooperative Agreement No. W911NF-10-02-0008 awarded by the U.S. Defense Threat Reduction Agency (DTRA). The Government has certain rights in this invention.

SUMMARY

Surface emitting laser structures that include a partially reflecting element disposed in the laser optical cavity are disclosed. Some embodiments involve vertical external cavity surface emitting laser (VECSEL) structures that include a pump source configured to emit radiation at a pump wavelength, $\lambda_{pump}$, an external out-coupling reflector, a distributed Bragg reflector (DBR) and an active region arranged between the DBR and the out-coupling reflector, the active region configured to emit radiation at a lasing wavelength, $\lambda_{lase}$. The structure also includes partially reflecting element (PRE) arranged between the gain element and the external out-coupling reflector. The partially reflecting element (PRE) has reflectivity of between about 30% and about 70% for the radiation at the lasing wavelength and reflectivity of between about 30% and about 70% for the radiation at the pump wavelength.

In some implementations, the PRE has reflectivity of between about 40% and about 60% for radiation at the lasing wavelength and reflectivity of between about 40% and about 60% for radiation at the pump wavelength. In some structures, the PRE comprises a lattice of III-V material layers.

During operation of the VECSEL structure, the partially reflecting element can be configured to provide a peak $E^2$ field in the active region that is greater than the average $E^2$ field in the substrate by a factor of more than 2, 3, 4 or even greater.

In some configurations, the pump source is arranged so that the radiation emitted by the pump source is incident on a surface of the substrate at an angle $\theta$ such that $\sin(\theta) = n_{sub} \sin[\cos^{-1}(\lambda_{pump}/\lambda_{lase})]$ where the index of refraction of the substrate is $n_{sub}$. The external out-coupling mirror, DBR, gain region, and PRE can be arranged so that more than about 50% or even more than about 75% of the pump radiation is absorbed in the active region.

According to some aspects, the PRE comprises a distributed Bragg reflector comprising a number of layer pairs, each layer pair comprising a first layer of AlGaN and a second layer of GaN. The first and second layers can be epitaxially grown on a GaN substrate. For example, the PRE may include between 2 and 20 layer pairs or between about 10 and 12 layer pairs. A thickness of the first layer can be about $\lambda_{lase}/4n_{AlGaN}$ ($\lambda_{lase}$) and a thickness of the second layer cam be about $\lambda_{lase}/4n_{GaN}(\lambda_{lase})$. For example, in one implementation, the thickness of the first layer is about 50 nm and a thickness of the second layer is about 46 nm. In some cases an antireflective coating is disposed between the substrate and the out-coupling reflector. The antireflective coating can have an index of refraction $n_{AR}$ and a thickness $t_{AR}$ such that $t_{AR} = (\lambda_{pump}/4n_{AR}) \cos[\sin^{-1}((1/n_{AR})\sin\theta)]$.

Some embodiments are directed to a surface emitting laser structure including a first reflector, a second reflector, and an active region arranged between the first reflector and the second reflector, the active region configured to emit radiation at a lasing wavelength, $\lambda_{lase}$. At least a portion of a substrate is arranged between the gain element and the first reflector. The substrate has a first surface proximate the gain element and a second surface proximate the first reflector. A partially reflecting element (PRE) is epitaxially grown on the first surface of the substrate. The partially reflecting element having reflectivity of between about 40% and about 60% for radiation at the lasing wavelength and reflectivity of between about 40% and about 60% for radiation at a pump wavelength. In some implementations, the substrate portion has a thickness of about 100 μm.

DESCRIPTION OF VARIOUS EMBODIMENTS

Surface emitting lasers (SELs), such as vertical cavity surface emitting lasers (VCSELs) and vertical external cavity surface emitting lasers (VECSELs) are of interest due to the high quality of spectral and spatial optical lasing characteristics. Realization of SELs within the III-nitride material system is challenging because of the pump power required to produce sufficient power output for many applications. Embodiments discussed herein involve SELs that include three reflecting elements. In addition to the reflecting elements that form the optical cavity for the laser, a third reflector, which is partially reflecting, is disposed within the optical cavity of the laser. The third reflector increases recycling of the laser radiation through the active region of the laser, reducing the threshold power needed for lasing in the SEL and leading to greater lasing efficiency. Some embodiments provided below illustrate operation of a third reflector disposed within the laser optical cavity of optically pumped lasers. These approaches exemplified by these embodiments can be extended to lasers that use diode current injection as an excitation mechanism.

Some embodiments discussed herein use an active region configured to resonate at two distinct wavelengths, the wavelength of the laser radiation and the wavelength of the pump radiation. Quantum well structures within the active region are positioned so that they overlap both the antinodes of the pump standing wave field and the antinodes of the laser standing wave field.

Figure 1:
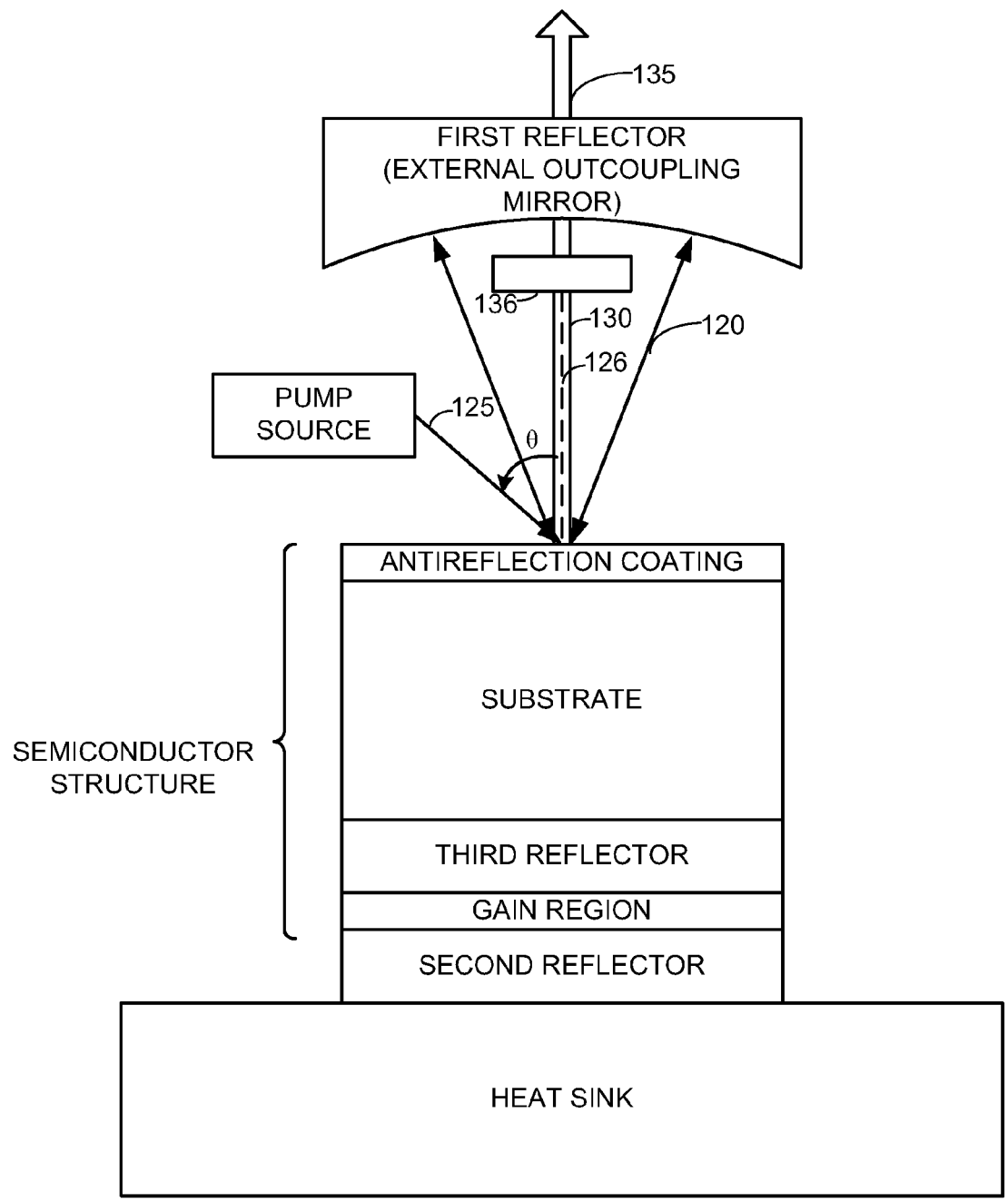
FIG. 1 is a diagram of an optically pumped vertical external cavity surface emitting laser (VECSEL) device that incorporates three reflecting elements.

FIG. 1 is a diagram of an optically pumped VECSEL device that incorporates three reflecting elements. The VECSEL comprises an optical pump source, first reflector which is the external out-coupling mirror for the device, a second reflector, e.g., comprising a distributed Bragg reflector (DBR), and a semiconductor structure that includes a gain structure and a third reflector, which is a partially reflecting element. The laser optical cavity is bounded by the external out-coupling mirror and the second reflector. The third reflector is disposed within the optical cavity.

The pump source emits pump radiation 125 which is focused towards the substrate. For example, the VECSEL device may include focusing optics configured to focus the pump radiation onto a spot on the substrate (or anti-reflection coating, if present) by focusing optics. The pump radiation may be incident on the semiconductor structure at an angle, $\theta$ with respect to the optical axis of the device indicated by dashed line 126. In some cases, the substrate may be thinned to a thickness that facilitates handling the device, e.g., on the order of about 100 µm, for example. Some radiation 130 generated within the active region of the semiconductor structure (denoted herein as laser radiation) travels through the substrate, out of the semiconductor structure, and toward the external out-coupling mirror, which is designated the first reflector. Some of the radiation generated in the active region passes through the concave out-coupling mirror and is output from the VECSEL device, as indicated by arrow 135 which designates the output laser radiation. A majority of the laser radiation is reflected back to the semiconductor structure, as indicated by arrows 120. The substrate may optionally be coated with anti-reflection coating to reduce the reflection of the recycled laser radiation 120 and/or the pump radiation 125. The antireflection coating can have an index of refraction, $n_{AR}$, and a thickness, $t_{AR}$, such that $t_{AR} = (\lambda_{pump}/4n_{AR}) \cos[\sin^{-1}((1/n_{AR})\sin \theta)]$, where $\lambda_{pump}$ is the wavelength of the pump radiation.

Some implementations include an optional frequency converter 136, such as a nonlinear optical crystal that generates radiation at harmonics or at sum or difference frequencies of the laser radiation, disposed within the external cavity. Using a frequency converter, laser outputs 135 in the deep UV spectrum, e.g., less than 300 nm, or even less than about 250 nm, can be obtained from laser wavelengths less than 600 nm.

In one embodiment, the pump source is a gallium nitride (GaN)-based laser diode (or, alternatively, a plurality of laser diodes) emitting in the range of 370-460 nm, and in some embodiments, at 405 nm or 445 nm. The output power of the pump source may be in the range of 1-10 watts. The pump source may include optics that provide a focusing system comprising one or more lenses to focus the pump radiation to a pump beam spot size of 50-200 µm diameter in order to achieve a power density of more than 50 kW/cm². The output of pump source forms the optical pump that drives the active region. The active region outputs a laser radiation beam at a desired wavelength, for example in the range of 440 nm-550 nm. The external out-coupling mirror may be coated by dielectric layers in order to provide mirror reflectivity at the output wavelength of semiconductor gain region of 99.5% or more.

During operation, the semiconductor structure can become hot. To reduce the possibility of damage to the device due to excess heat generation, the device may be mounted on a heat sink with the second reflector proximate to the heat sink. The heat sink may, for example, be comprised of copper, diamond, or other heat-conducting material. In some cases, an optional second heat sink may be added using laser lift off techniques. In this scenario, laser lift-off is performed to remove the substrate, or the substrate is thinned to a thin substrate remnant. A second heat sink is then mounted to the exposed backside of the third reflector or thin substrate remnant. The completed structure includes two heat sinks, one proximate the second reflector and one proximate the third reflector, with the substrate removed. In the latter example, the second heat sink includes an aperture through which the device is pumped and laser radiation is emitted.

Figure 2:
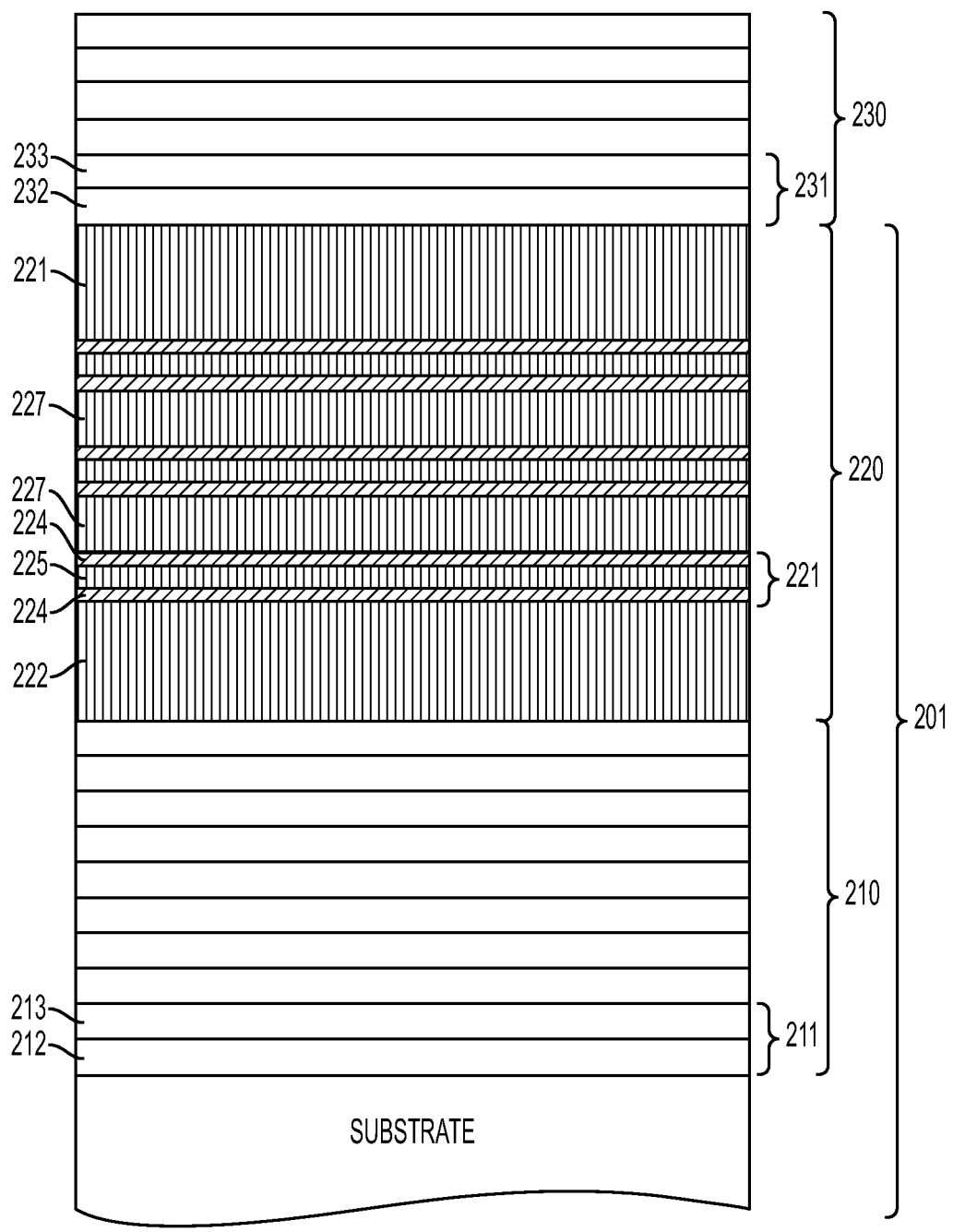
FIG. 2 shows portions of the semiconductor structure and second reflector of FIG. 1 in more detail.

FIG. 2 shows portions of the semiconductor structure 201 and second reflector 230 in more detail. In this example, the semiconductor structure 201 includes a substrate having a thickness sufficient to allow the VECSEL device to be handled, e.g., on the order of about 100 µm. A suitable material for the substrate includes GaN, AlN, AlGaN, InGaN, InAlN, AlInGaN, or other materials than have low absorption at both the pump and lasing wavelengths.

The third reflector 210, designated herein as a partially reflecting element (PRE), is partially reflective to both the pump radiation and the laser radiation. The third reflector 210 is grown over the substrate and may comprise a superlattice of III-V materials, such as a III-nitride superlattice of 5-20 pairs 211 of AlGaN/GaN or InAlN/GaN. For example, in the example of FIG. 2, the first layer 212 of each pair 211 may comprise GaN and the second layer 213 of each pair 211 may comprise AlGaN or InAlN. The third reflector may comprise layer pairs of $In_xAl_yGa_{1-x-y}N/In_uAl_vGa_{1-u-v}N$. Devices having a PRE disposed within the laser optical cavity reduce the required pump power to achieve lasing due to a higher absorption of the pump radiation in the active region and the increased electric field intensity of the lasing beam in the active region relative to the intensity in the substrate, where losses may occur.

In some implementations, the second reflector 230 may comprise a dielectric DBR comprising a number of pairs of dielectric material to achieve a specified amount of reflectivity. For example, the dielectric DBR may comprise 8 pairs of 52 nm $TiO_2$/79 nm $SiO_2$ ¼-wavelength layers yielding 99.9% reflectivity at the laser and pump wavelengths of about 460 nm. The second reflector 230 may be formed over the gain structure by such methods as electron beam evaporation (EBE) and/or by sputtering.

The semiconductor structure 201 includes an epitaxial gain region 220 grown over the partially reflecting element 210. In some implementations, gain region 220 comprises a plurality of (e.g., 5-20) quantum wells 224 separated by spacer layers, 225, 227. Quantum well structures 221 may comprise one quantum well or multiple closely spaced quantum wells. FIG. 2 shows an embodiment in which each quantum well structure 221 includes dual quantum well layers 224 separated by a thin spacer layer 225. The thin spacer 225 disposed between the quantum wells 224 in a quantum well structure 221 is thinner than the spacer layers 227 between the quantum well structures 221. Thus, the spacers 225 disposed between the quantum wells are referred to herein as thin spacers and the spacers 227 between the quantum well structures 221 are referred to herein as thick spacers, to denote the relative thickness difference between the two types of spacers. There may also be end spacer layers between the quantum well structures and the mirrors. The thickness of these end spacer layers will in general be different than the thick or the thin spacer layers.

In some implementations, each quantum well structure 221 includes a pair of $In_xGa_{1-x}N$ quantum well layers 224, where $0.10 \leq x \leq 0.5$ separated by a thin spacer of GaN. In general, the quantum well structures can have one or more quantum wells. Each quantum well layer 224 has a thickness of about 3 nm and the thin GaN spacer layer 225 disposed between the quantum well layers 224 has a thickness of about 5 nm. The quantum well structures 221 are separated from each other by thick GaN spacers 227 having a thickness of about 80 nm. The first quantum well structure of the active region 220 may be separated from the third reflector 210 by a GaN layer 222 having a thickness of about 87 nm and the last quantum well structure of the active region 220 may be separated from the second reflector 230 by a GaN layer 223 having a thickness of about 87 nm.

The pump radiation beam forms a standing wave within gain region 220 with a plurality of stationary first antinodes. The laser radiation also forms a standing wave within the active region 220 with a plurality of stationary second antinodes. The quantum well structures 221 are spaced apart from one another such that each quantum well structure 221 is located at an anti-node position of the standing wave pattern of the laser radiation 260 and the pump radiation 250.

Gain structure 220, comprised of a total of N layers, has an optical thickness, OT, determined as:

$$OT = \sum_0^N (thickness_n)(refractive\ index_n),$$

where the layers, n, include the quantum well layers 224, the thin spacer layers 225, the thick spacer layers 227, and the two end spacer layers 221, 222 separating the first and last quantum well layers from the reflectors 230, 210. That is, gain region 220 has an optical thickness which is the sum of the product of the thickness of each layer multiplied by that layer's refractive index. The active region is designed such that its optical thickness is close to an integer multiple of ½ $\lambda_{lase}$, where $\lambda_{lase}$ is the laser radiation wavelength. Because the optical thickness depends on the indices of refraction, which may vary with wavelength, the optical thickness may vary with wavelength. A possible design of the active region is therefore one in which $OT(\lambda_{lase})=(N_{pairs}+1)$ ½ $\lambda_{lase}$, where $N_{pairs}$ is the integer number of pairs of quantum wells. In this design the antinodes of the standing wave pattern of the lasing radiation have a large overlap with the quantum wells. By properly choosing the angle of incidence and wavelength of the pump laser it is possible to achieve a standing wave pattern having antinodes that overlap with the quantum wells.

The PRE 230 may comprise a superlattice of III-V materials. In one example, the PRE 230 includes 10 layers of AlGaN with a target index of refraction of 2.30. The thickness of each AlGaN layer is about 50 nm. The AlGaN layers are separated by a GaN layer having a thickness of 46.4 nm. The index for AlGaN is consistent with a reflectivity measurement for an AlGaN/GaN DBR. It is also possible to employ other III-V or III-nitride combinations for the partially reflecting element. For example, as previously discussed, InAlN may be used instead of AlGaN to form the PRE. The use of InAlN may facilitate forming good lattice matching between the InAlN and the GaN, leading to reduced strain and enhanced crystalline quality and performance. In general the PRE is designed so that it allows an amount of transmissivity of both the pump radiation and the lasing radiation beam that provides optimal absorption in the quantum wells. For example, in some embodiments, the PRE may be designed to have a transmissivity of about 50% for a pump wavelength and a transmissivity of about 50% for laser radiation having a wavelength, as discussed in more detail below.

As previously mentioned, if the active region (the quantum wells and spacer layers) exhibits fundamental resonance at the pump wavelength the absorption efficiency is greatly enhanced. The active region thickness may cover several periods of the laser mode standing wave and/or the pump mode standing wave.

Figure 3:
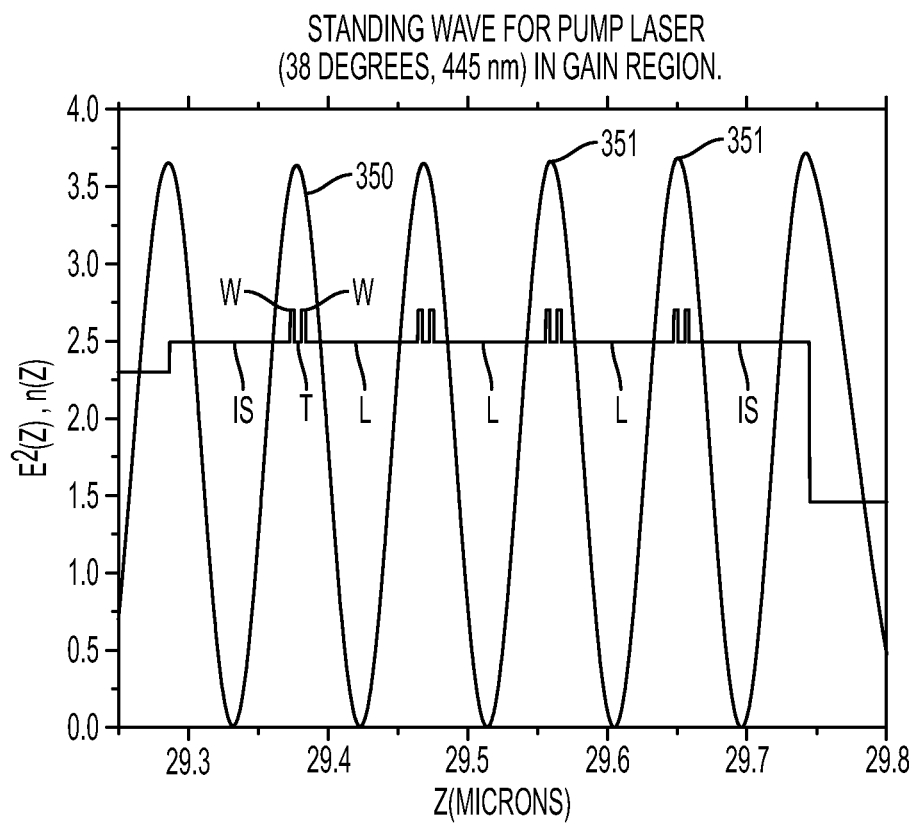
FIG. 3 shows a standing wave in the active region for pump radiation having a wavelength of 445 nm and an angle of incidence of 38 degrees.
Figure 4:
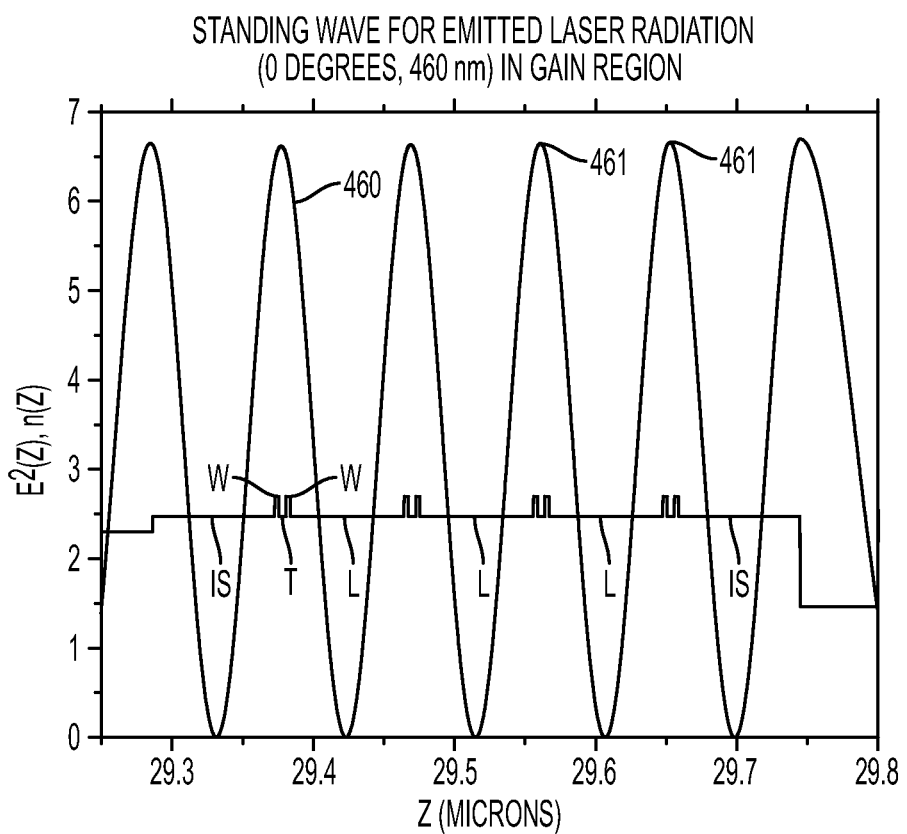
FIG. 4 shows a standing wave in the active region for laser radiation emitted normal to the active region surface and having a wavelength of 460 nm.

FIGS. 3 and 4 show the $E^2$ electrical field and the index of refraction as a function of distance from the PRE. FIG. 3 shows the standing wave pattern 350 and stationary antinodes 351 for the pump laser radiation incident at 38 degrees and having wavelength 445 nm in an active region. FIG. 4 shows the standing wave pattern 460 and stationary antinodes 461 for laser radiation having wavelength 460 nm in the same gain region as FIG. 3. The active region for this example has $N_{pair}=4$, thin GaN spacer layers (the thickness of the thin spacers is indicated by "T" in FIGS. 3 and 4) of thickness 5 nm, InGaN quantum wells (the thickness of the quantum wells is indicated by "W") having widths of 3 nm, thick GaN spacer layers (the thickness of the thick spacers is indicated by "L") of thickness 80.6 nm, and end GaN spacer layers (the thickness of the end spacers is indicated by "IS") of thickness 86.3 nm. As shown in FIGS. 3 and 4, the antinodes 351, 461 of both the pump laser radiation standing wave 350 and the emitted laser radiation standing wave 460 overlap with the quantum wells (W) in this gain region.

Figure 5:
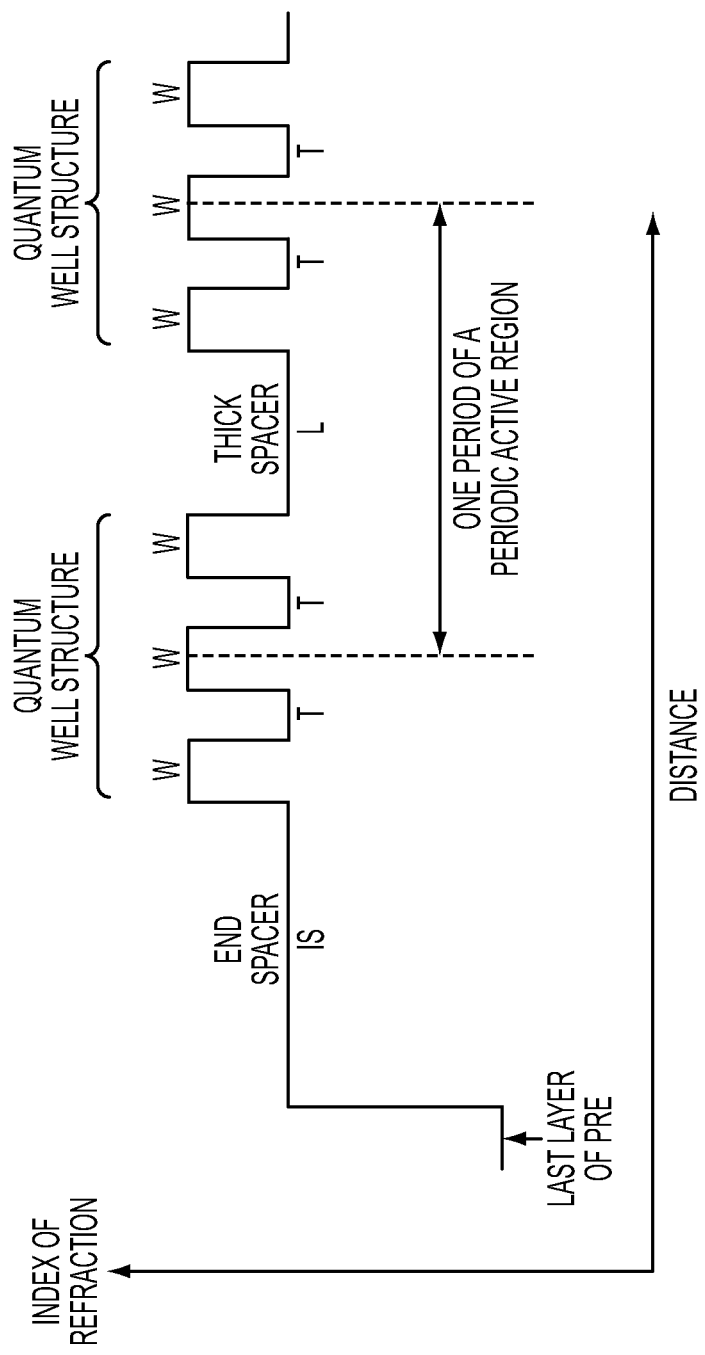
FIG. 5 shows the refractive index for a portion of an example VECSEL structure that includes an end spacer GaN adjacent to the last PRE layer, triple InGaN quantum wells separated by thin GaN spacers, and thick GaN spacers between each period of triple quantum wells.

FIG. 5 shows the refractive index for a portion of an example VECSEL structure that includes a GaN end spacer adjacent to the last PRE layer, triple InGaN quantum wells separated by thin GaN spacers, and thick GaN spacers between each period of triple quantum wells. FIG. 5 indicates one period of an active region as the center to center distance between the quantum well structures. In this example, $$OT(end\ spacer)+½N_{wells}OT(Well)+½(N_{wells}-1)OT(thin\ spacer)=½\lambda_{lase}*m'$$

and $$OT(thick\ spacer)+N_{wells}OT(Well)+(N_{wells}-1)OT(thin\ spacer)=½\lambda_{lase}*m$$

where OT(end spacer), OT(thick spacer), OT(thin spacer), and OT(Well) denote the optical thicknesses of the end spacer, the thick spacer, the thin spacer, and the optical well, respectively, $N_{wells}$ is here the number of quantum wells in each period, and m' and m are integers greater than or equal to one. Typically m'=m=1. In some instances it may be beneficial to increase m or m' to 2 or more.

OT(end spacer)=IS $n_{GaN}$, where $n_{GaN}$ is the index of refraction of GaN,

OT(Well)=W $n_{InGaN}$, where $n_{InGaN}$ is the refractive index of InGaN,

OT(thin spacer)=T $n_{GaN}$ and OT(thick spacer)=L $n_{GaN}$.

Making the substitutions for the OTs into the equations above for m=m'=1, $$ISn_{GaN}+½N_{wells}Wn_{InGaN}+½(N_{wells}-1)Tn_{GaN}=½\lambda_{lase},$$

and $$Ln_{GaN}+N_{wells}Wn_{InGaN}+(N_{wells}-1)Tn_{GaN}=½\lambda_{lase}.$$

The minimum end spacer thickness is: $IS=\frac{1}{2}\lambda_{lase}-\frac{1}{2}N_{wells}W n_{InGaN}-\frac{1}{2}(N_{wells}-1)T n_{GaN}$. In some cases, a thicker end spacer may be used. The thickness of the end spacer may be increased by adding an integer multiple, K, of $\frac{1}{2}\lambda_{lase}/n_{GaN}$ to the thickness of the end spacer.

Figure 6:
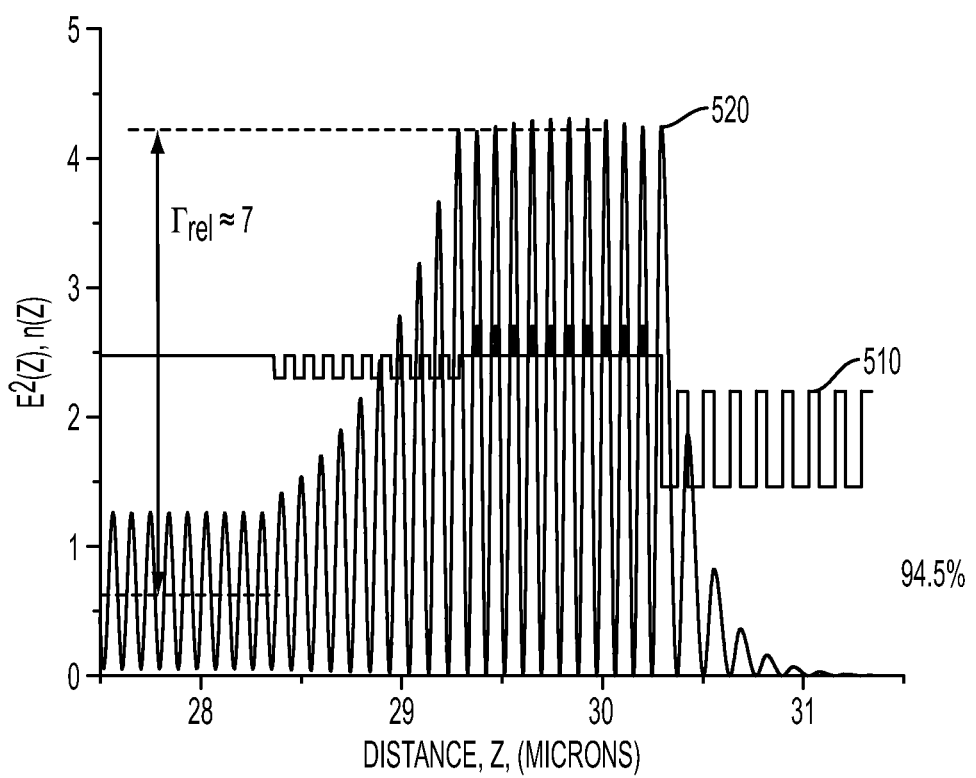
FIG. 6 shows the profile of the refractive index and $E^2$ field intensity calculated for VECSEL device illustrated in FIGS. 1 and 2.

FIG. 6 shows the profile of the refractive index and $E^2$ field intensity calculated for VECSEL device as illustrated in FIGS. 1 and 2. This VECSEL emits laser radiation at 460 nm in a direction substantially parallel to the optical axis of the gain structure. The active region is pumped with 445 nm pump radiation incident on the surface of the semiconductor structure (upon which may be disposed an antireflection coating) at an angle of θ=38 degrees. There is a relationship between the pump wavelength $\lambda_{pump}$, the lasing wavelength $\lambda_{lase}$, the index of refraction of the substrate $n_{sub}$, and the optimum angle of incidence of the pump θ. This condition arises from enforcing the condition of having optimal overlap of the antinodes of both the pump beam and the lasing beam with the quantum wells in the active region. The relation is as follows: $\sin(\theta)=n_{sub}\sin[\cos^{-1}(\lambda_{pump}/\lambda_{lase})]$. Therefore, if $\{\lambda_{pump}, \lambda_{lase}, n_{sub}\}$ are {445 nm, 460 nm, 2.45} then θ=38 degrees. If $\{\lambda_{pump}, \lambda_{lase}, n_{sub}\}$ are {400 nm, 460 nm, 2.45} then there is no θ that satisfies the condition. If $\{\lambda_{pump}, \lambda_{lase}, n_{sub}\}$ are {400 nm, 420 nm, 2.45} then θ=48 degrees. Some configurations involve a VECSEL device wherein the pump source is arranged so that the radiation emitted by the pump source is incident on a surface of the substrate at an angle θ such that $\sin(\theta)=n_{sub}\sin[\cos^{-1}(\lambda_{pump}/\lambda_{lase})]$ where the pump wavelength is $\lambda_{pump}$, the lasing wavelength is $\lambda_{lase}$, and the index of refraction of the substrate is $n_{sub}$. While this condition is optimal, lasing may occur even if an optimal θ is not achieved. For GaN substrate, where n=2.45 then the ratio of $\lambda_{pump}/\lambda_{lase}$ should be greater than about 0.91 in order to achieve the optimal overlap at some angle of incidence.

In one design example, gain occurs in an active region comprising a 10×2 series of InGaN quantum wells as previously described in connection with FIG. 2. The third reflector PRE comprises a superlattice of 10 layer pairs of AlGaN/GaN with a target index of refraction of 2.30. The thickness of each AlGaN layer is about 50 nm and the thickness of the each GaN layer is about 46.4 nm. In the active region, the end spacer GaN layers have a thickness of about 87 nm, the thick spacer layers have a thickness of about 80 nm, the thin spacer layers have a thickness of about 5 nm and the InGaN quantum wells have a thickness of 3 nm.

FIG. 6 shows the index of refraction, n(z) 510, of the device as a function of the distance from the substrate surface. In this example, the substrate is coated with an antireflection coating. Also shown in FIG. 5 is a plot of the electric field as a function of distance from the substrate surface, $E^2(z)$ 520. The $E^2$ field corresponds to the laser radiation of wavelength 460 nm in vacuum. A separate calculation for this particular design indicates that the absorption of 445 nm pump radiation incident at 38 degrees is about 94.5%.

Note in FIG. 6 that the peak $E^2$ field in the InGaN gain region is enhanced by a factor $\Gamma_{rel} \approx 7$, in comparison to the average field in the GaN substrate, where loss may be expected. Although the absorption coefficient is fairly small in the GaN substrate, e.g., on the order of about 1 cm$^{-1}$, there can be significant loss if the substrate is sufficiently thick to achieve mechanical stability, e.g., about 400 μm. Because the gain or loss in any particular region of the structure will be proportional to $E^2$ in that region, a design that produces an enhancement in the field intensity in an active region compared to the loss region is beneficial. The factor, $\Gamma_{rel}$ enters into the calculation of pump power required to achieve lasing. For the gain to overcome the loss and allow lasing to occur, the magnitude of $E^2$ should be large in the active region in comparison to that in the GaN substrate. To decrease losses, it is also beneficial to decrease the thickness of the GaN substrate as much as possible while still maintaining sufficient structural support for mechanical stability.

As will be appreciated from FIG. 6, a significant increase in the $E^2$ field occurs in the PRE region, and the use of a PRE in the optical cavity may increase the parameter $\Gamma_{rel}$ by a factor of 2, 3, 4, or higher, e.g., about 7, over the $E^2$ field in the substrate.

Losses in the GaN substrate may arise from weak absorption or scattering of the sub-band-gap radiation. The extinction coefficient k in some GaN substrates may be estimated as k=5×10$^{-6}$. Based on this extinction coefficient, an absorption constant, α, in the GaN substrate can be estimated as 1.4 cm$^{-1}$, ($\alpha=2\omega k/c=4\pi k/\lambda$, where ω is the frequency of the radiation, λ is the wavelength of the radiation and c is the speed of radiation in a vacuum). Using α=1.4 cm$^{-1}$ and $T_{loss}=\exp(-2\alpha L_{GaN})$, the loss arising from this absorption can be calculated for various thicknesses, $L_{GaN}$, of the GaN substrate as shown in Table 1.

TABLE 1

| Thickness of GaN (μm) | $T_{loss}$ |
|---|---|
| 100 | 0.97 |
| 250 | 0.93 |
| 400 | 0.89 |

Figure 7:
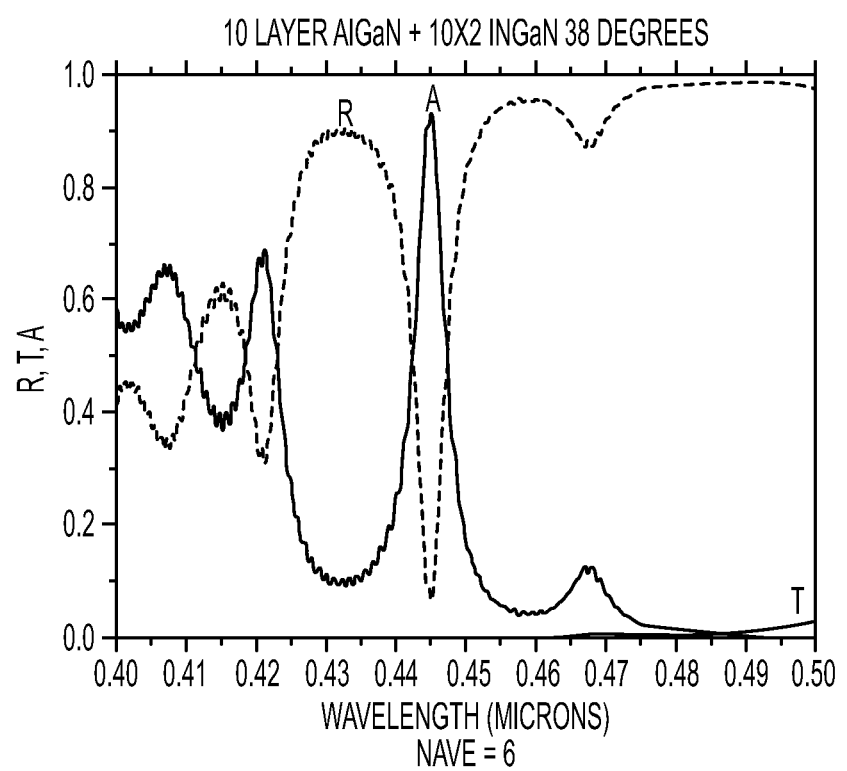
FIG. 7 shows plots of the reflectance (R), transmission (T), and absorption (A) as a function of wavelength. Absorption (A) of the pump beam occurs in the active region of a VECSEL.

The estimated pump power required to achieve lasing in the device is given by:

$$P_{th}=N_{th}E_{ph}N_wL_wA_p/f_{abs}\tau(N_{th})\qquad [1]$$

where $N_{th}$ is the carrier density at threshold, $E_{ph}$ is the photon energy, $N_W$ is the number of InGaN quantum wells, $L_w$ is the thickness of the wells, $A_p$ is the area of the focused pump beam, $f_{abs}$ is the fraction of power absorbed and $\tau(N_{th})$ is the carrier lifetime at the carrier density threshold. The dependence of gain on carrier density can be determined as:

$$g=g_0\ln(N/N_0),\qquad [2]$$

where $g_0$ is the material gain, N is the carrier density and $N_0$ is the transparency carrier density. For InGaN, $g_0$ can be estimated as 2400 cm$^{-1}$. The required power to achieve lasing depends on how much radiation is absorbed in the resonant periodic gain region. The fraction of radiation absorbed in the active region as a function of the wavelength of pump radiation was estimated by simulation, and the result is shown in FIG. 7. The design including a third reflector as discussed in connection with FIGS. 2 and 3 (445 nm pump radiation incident at 38 degrees) allows resonant absorption in the active region and more than 90%.

FIG. 7 shows plots of the reflectance (R), transmission (T), and absorption (A) as a function of wavelength in the active region of a device such as the device illustrated in FIGS. 1 and 2. In this example, the device includes a third reflector PRE with pump radiation incident at 38 degrees. The PRE comprises 10 AlGaN/GaN layer pairs and the active region has 10×2 InGaN quantum wells separated by GaN spacers as previously discussed. As indicated in FIG. 7, for this device, more than 90% of the radiation is absorbed in the InGaN quantum wells for pump wavelengths close to 445 nm.

The carrier lifetime, T, as a function of the carrier density, N, is given as follows:

$$1/\tau(N)=A+BN+CN^2,\qquad [3]$$

where coefficients for A, B, and C can be measured. For example, A, B, and C have been measured for $In_xGa_{1-x}N$ (x≈15%) by Y. C. Shen et al. as reported in Applied Phys. Lett. 91, 141101 (2007).

The threshold carrier density is:

$$N_{th}=N_0[1/(R_1R_2T_{loss})]^{1/G}, \quad [4]$$

where $N_0$ is the transparency carrier density, $R_1$ is the reflectivity of the external out-coupling mirror (first reflector) and $R_2$ is the reflectivity of the dielectric DBR (second reflector), and $T_{loss}$ is the factor arising from loss in the GaN substrate.

The gain factor G in the exponent depends on the material gain $g_0$ of the quantum wells, the number of wells, $N_w$, the thickness of each well, $L_w$. $\Gamma_{rel}$ is equal to the ratio of peak $E^2$ in the quantum wells to the average value of $E^2$ in the loss region, as indicated in FIG. 6, which can be expressed:

$$G=2\Gamma_{rel}g_0N_wL_w. \quad [5]$$

Figure 8:
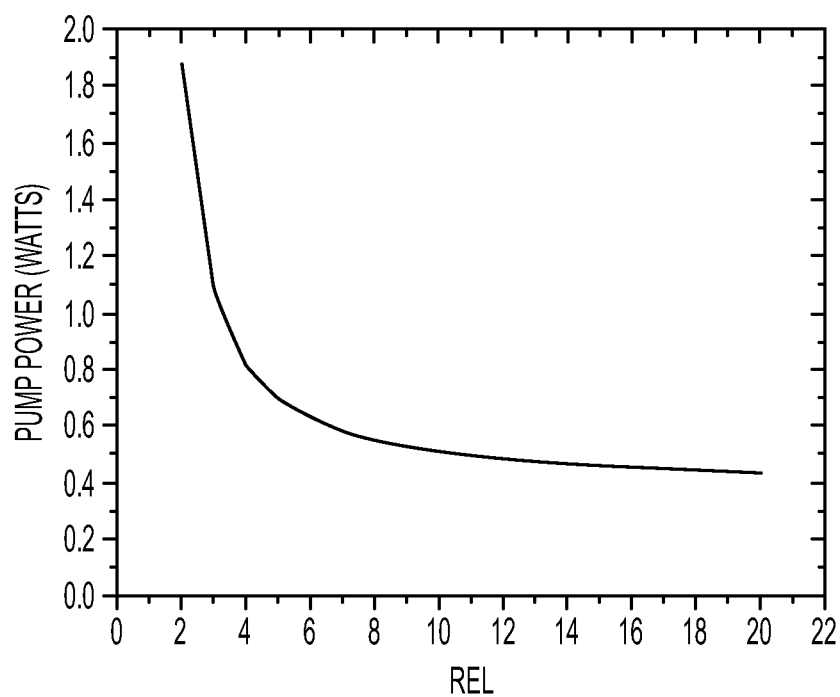
FIG. 8 is a plot that shows an estimated pump power required to achieve lasing as a function of $\Gamma_{rel}$.

The third reflector disposed in the laser optical cavity makes it possible to achieve large values of $\Gamma_{rel}$. FIG. 8 shows the threshold pump power, $P_{th}$, calculated using equation [1] above. The pump power required for lasing drops quickly as $\Gamma_{rel}$ increases. As indicated in FIG. 8, pump power with $\Gamma_{rel}\approx 4$ requires less than one watt of pump power. The parameters used for the calculation are provided in Table 2.

TABLE 2

| | |
|---|---|
| E photon energy | 2.7 eV |
| D diameter of focused pump beam ($A_p = \pi D^2/4$) | 80 μm |
| Material gain parameter ($g_0$) | 2400 cm$^{-1}$ |
| $N_0$ (transparency carrier density) | 0.8 × 10$^{19}$ cm$^{-3}$ |
| $\Gamma_{rel}$ | 4 |
| $N_w$ (number of InGaN wells) | 20 |
| $L_w$ (thickness of InGaN wells) | 3 nm |
| $f_{abs}$ (fraction of pump power absorbed in the active region) | 95% |
| GaN substrate thickness | 100 μm |
| Absorption coefficient in GaN | 1.4 cm$^{-1}$ |
| $T_{loss}$ (distributed loss factor) | 97% |
| Mirror reflectivity for $R_1 = R_2$ | 99.5% |
| $P_{th}$ | 0.8 watts |
| $g_{th}$ | 840 cm$^{-1}$ |
| $N_{th}$ | 1.0 × 10$^{19}$ cm$^{-3}$ |
| τ | 2 × 10$^{-9}$ sec |

Note that, while the optically pumped VECSEL device used as an example above has been described in terms of particular materials, configuration of the active region, e.g., type, number and thickness of the quantum well region, it is to be understood that other material systems and device configurations could also be used in conjunction with a third reflector as discussed herein. Thus, the present disclosure is not limited to the material systems and device configurations that are described herein. It is contemplated that devices employing a variety of material systems, e.g., other III-V or III-nitride material systems, would benefit from the third reflector. In addition, the specific configuration of the active region could vary, e.g., a cluster of three quantum wells may be used instead of the quantum well pair described. In addition, although only one optical pumping source is described, it will be appreciated, that multiple pumping sources could be used.

Figure 9:
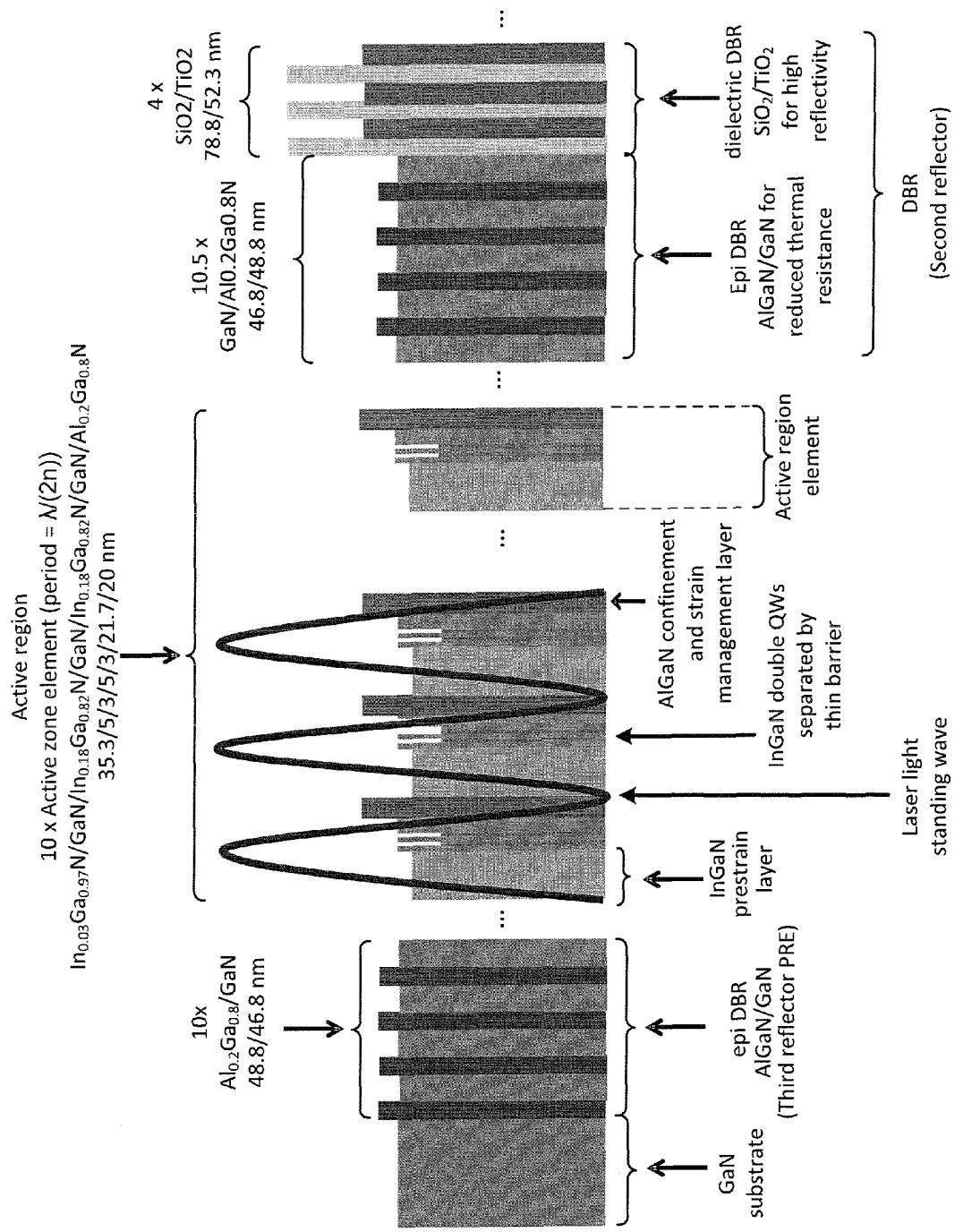
FIG. 9 is a more detailed view of a VECSEL structure employing a partially reflecting element (PRE)

FIG. 9 is a more detailed view of a VECSEL structure employing a PRE. The device layers are formed from left to right starting with the GaN substrate. The third reflector, which is a PRE, comprises a DBR partially reflective at the laser and pump wavelengths, is grown on the GaN substrate. The PRE may comprise 10 periods of $Al_{0.2}Ga_{0.8}N/GaN$, where the $Al_{0.2}Ga_{0.8}N$ layers are about 48.8 nm thick and the GaN layers are about 46.8 nm thick. For example, the thickness of the AlGaN layer may be about $\lambda_{lase}/4n_{AlGaN}(\lambda_{lase})$ and the thickness of the GaN layer can be about $\lambda_{lase}/4n_{GaN}$ ($\lambda_{lase}$).

The active region includes multiple active region elements, such as about 10 periods of active region elements, is grown on the PRE. Each of the active region elements includes a double quantum well structure based on InGaN. Each active region element may include in order the following layers: an InGaN pre-strain layer ($In_{0.03}Ga_{0.97}N$, 35.3 nm thick), a first thin spacer (GaN, 5 nm thick), a first quantum well, ($In_{0.18}Ga_{0.82}N$, 3 nm thick), a second thin spacer (GaN, 5 nm thick), a second quantum well, ($In_{0.18}Ga_{0.82}N$, 3 nm thick), a thick spacer (GaN, 21.7 nm thick), and an AlGaN carrier confinement and strain management layer ($Al_{0.2}Ga_{0.8}N$, 20 nm thick).

The second reflector may comprise one or more of epitaxial semiconductor layers and non-epitaxial dielectric layers arranged as a DBR. For example, in come configurations, the second reflector may comprise an epitaxial DBR comprising GaN/AlGaN, such as 10.5 periods of $GaN/Al_{0.2}Ga_{0.8}N$, where the GaN layers are about 46.8 nm thick and the AlGaN layers are about 48.8 nm thick. A second reflector portion comprising a non-epitaxial dielectric DBR may be deposited on the epitaxial DBR. For example, the dielectric DBR may comprise 4 periods of $SiO_2/TiO_2$, wherein the SiO2 layers are 78.8 nm thick and the $TiO_2$ layers are 52.3 nm thick. If two DBR mirrors are joined together to create a single hybrid DBR the highest reflectivity at the target wavelength is obtained when the high refractive index material of the first DBR is in contact with the low refractive index material of the second DBR. Thus the hybrid DBR will have contact between GaN and $SiO_2$ because GaN has a higher refractive index than AlGaN and $SiO_2$ has a lower refractive index than $TiO_2$. The dual DBR that includes an epitaxial semiconductor portion and a non-epitaxial dielectric can be used to achieve a specified thermal conductivity and reflectivity. The epitaxial semiconductor portion can have higher thermal conductivity than the non-epitaxial dielectric portion, whereas the non-epitaxial dielectric portion provides higher reflectivity than the epitaxial-semiconductor portion. In some cases, both the epitaxial DBR and the non-epitaxial DBR are ¼-wavelength DBRs.

Figure 12:
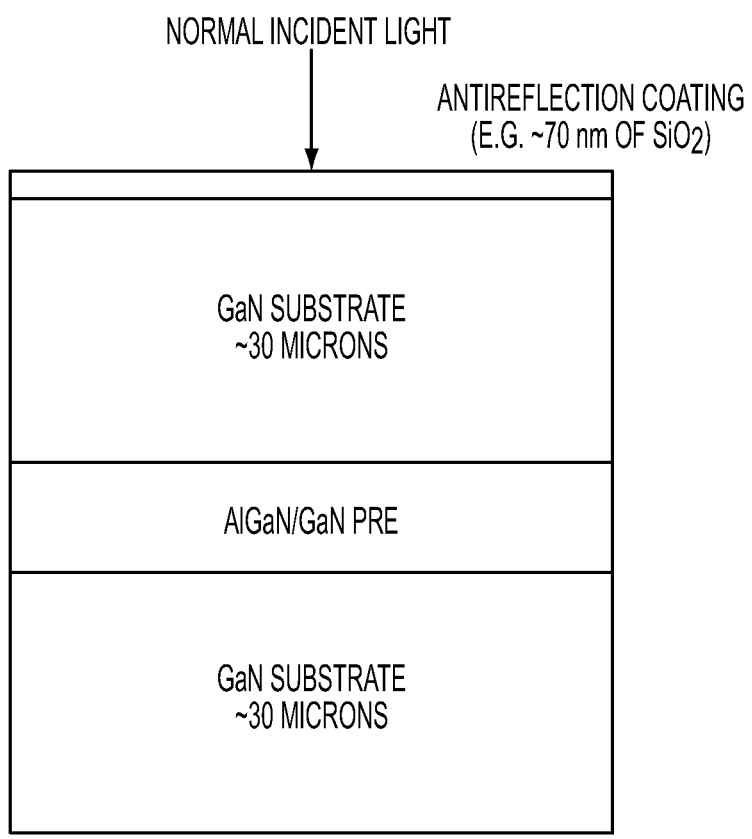
FIG. 12 shows the structure used to simulate reflectivity of an AlGaN/GaN PRE.

Analysis of the reflectivity of an isolated PRE embedded in GaN (as depicted in FIG. 12) shows that the optimum reflectivity of the PRE for achieving high absorption in an active region is near 50%. (The analysis is described below.) This design criterion is expected to be transferable to other optically pumped lasers employing any type of material. Other materials for which PREs may improve the performance of VECSELs include the III-V arsenides and phosphides.

The PRE may be designed to achieve a predetermined amount of reflectivity that produces a specified absorption of the pump and/or laser radiation in the active region. A two-step process was employed in the analysis. In the first step, the number of PRE layer pairs was determined based on calculations of the absorption in the active region as a function of wavelength, A(λ), and as a function of number of layers of the PRE. In the second step, the reflectivity of an isolated PRE embedded in GaN (as depicted, for example, in FIG. 12) was calculated.

Figure 10:
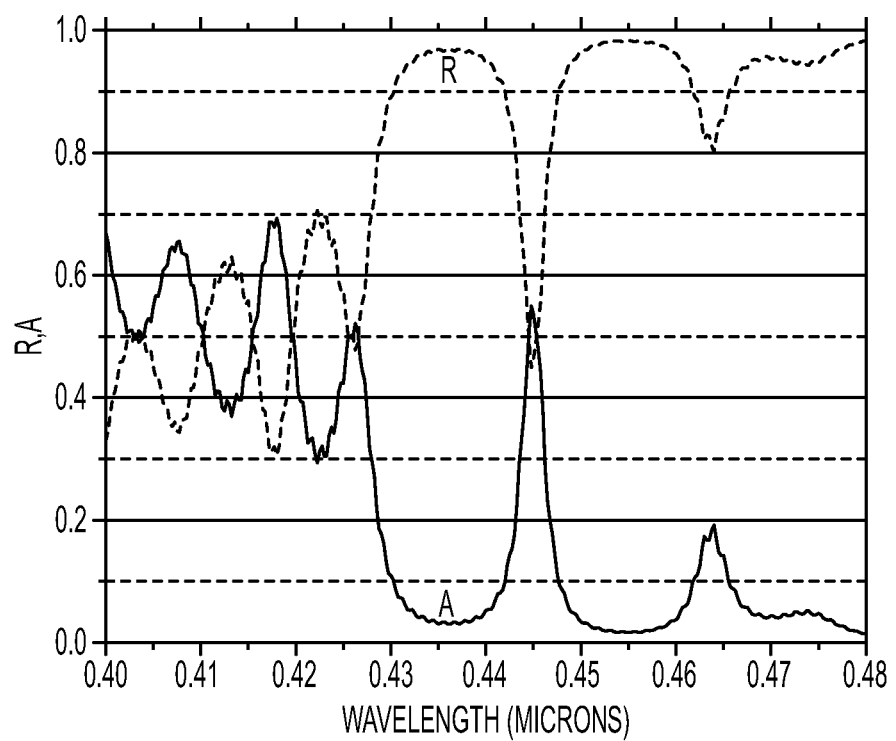
FIG. 10 shows A($\lambda$) for a VECSEL incorporating a PRE having 20 pairs of AlGaN/GaN.
Figure 11:
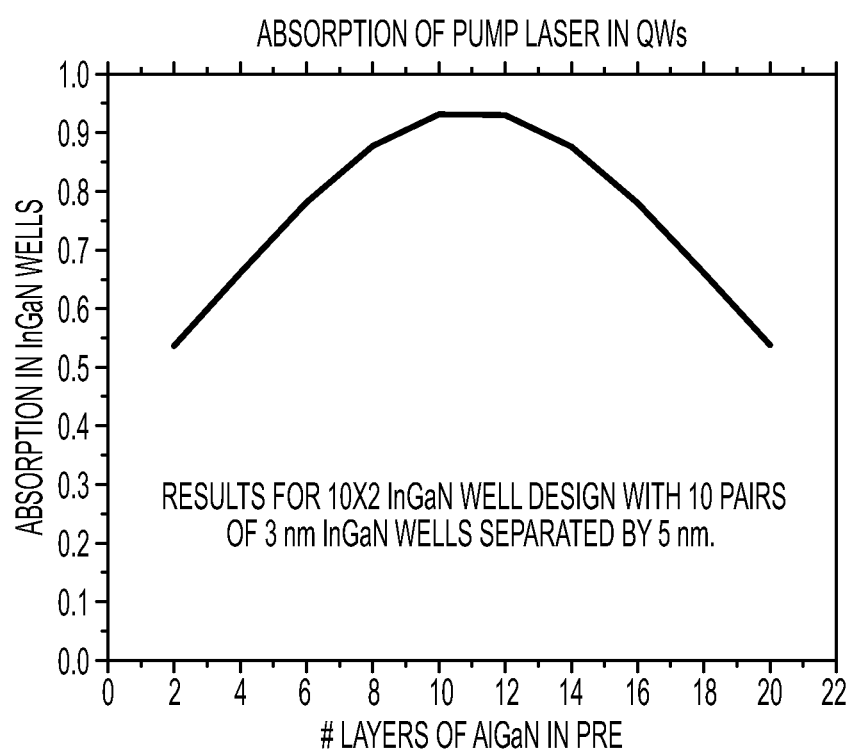
FIG. 11 shows the absorption of the pump radiation in the active region as a function of number of PRE layer pairs.

In connection with step 1, FIG. 7 shows calculations of A(λ) in the 10×2 InGaN gain region of a device that includes a PRE comprising 10 pairs of AlGaN/GaN with structure and composition similar to the device as discussed in connection with FIG. 9. FIG. 10 shows A(λ) for the same structure when PRE layers are increased to 20 pairs of AlGaN/GaN. In this scenario, the device performance would be degraded because only about 55% of the pump radiation is absorbed in the active region for a pump wavelength of $\lambda_{pump}$=445 nm. The result of extending these calculations to include different numbers of layers for the PRE is depicted in the graph of FIG. 11. FIG. 11 shows the absorption of the pump radiation in the active region as a function of number of PRE layer pairs. It will be appreciated from FIG. 13 that absorption of the pump radiation is greater than about 50% for about 2 to about 20 layers, is greater than about 60% for about 4 to about 18 layers, and is greater than about 90% at about 10 to about 12 layer pairs.

Figure 13:
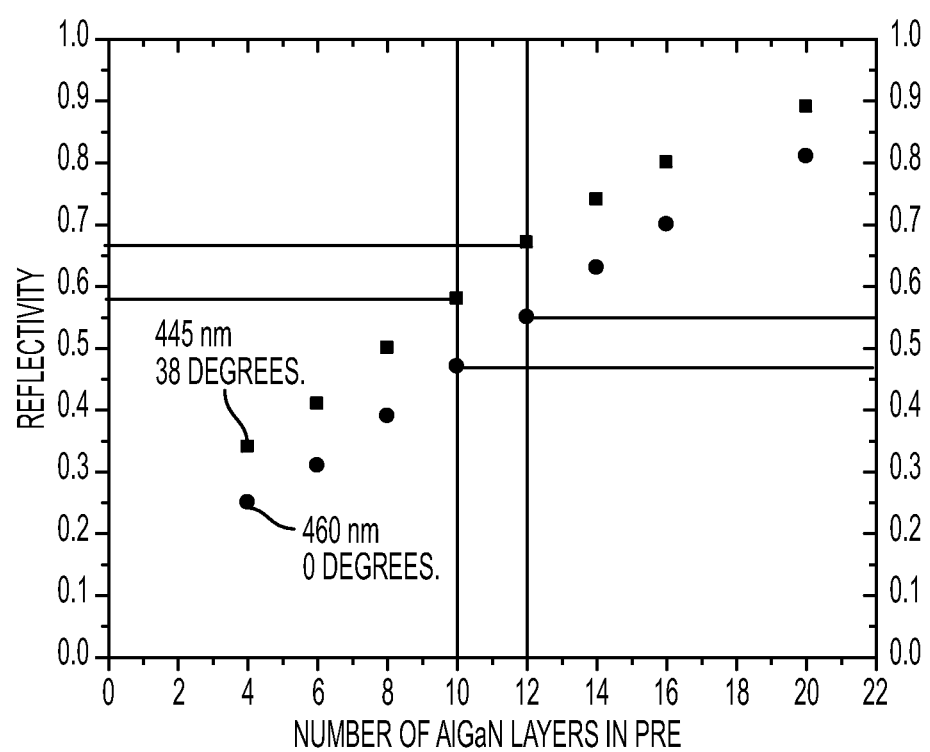
FIG. 13 is a graph of reflectivity as a function of the number of PRE layers.

In connection with step 2, a measure of reflectivity of the PRE can be obtained by embedding the PRE in GaN and modeling reflectivity, R, for incident radiation. The reflectivity as a function of wavelength is calculated below as a function of the number of layers of AlGaN in the PRE. The simulated structure is illustrated in FIG. 12 showing the AlGaN/GaN PRE with layers of about 30 μm of GaN on either side. An antireflection coating comprising about 70 nm of $SiO_2$ is disposed on the top GaN layer. Reflectivity as a function of λ, R(λ), is calculated as a function of the number of layers of the AlGaN PRE. FIG. 13 shows the reflectivity of the PRE as a function of the number of AlGaN layers for both 445 nm radiation incident at 38 degrees and 460 nm radiation at normal incidence (0 degrees). The calculations were performed for the structure shown in FIG. 12. FIG. 11 indicates that the optimal number of AlGaN layers is in the range from 10 to 12. FIG. 13 shows that in general a PRE should have a reflectivity between about 40% and about 60% for normally incident radiation. Although we have arrived at this result through analysis of a particular system, we expect it to be valid for other systems in which PREs and gain regions are employed. From the analysis discussed in connection with 10 through 13, it is apparent that a PRE having between about 2 and about 20 AlGaN/GaN pairs increases the absorption in the active region. For optimal absorption, between about 2 to about 20 or about 10 and about 12 pairs may be used.

A number of values and ranges are provided in various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in view of the above teaching.

The invention claimed is:

1. A vertical external cavity surface emitting laser (VECSEL) structure, comprising:
   an external out-coupling reflector;
   a distributed Bragg reflector (DBR); and
   a III-N heterostructure epitaxially grown on a GaN substrate and comprising:
      an active region arranged between the DBR and the out-coupling reflector, the active region configured to emit radiation at a lasing wavelength, $\lambda_{lase}$ in response to pump radiation emitted from a pump source and having pump wavelength, $\lambda_{pump}$; and
      a partially reflecting element (PRE) comprising alternating epitaxial layer pairs, including a first layer of AlGaN, InAlN, or InAlGaN and a second layer of GaN or InAlGaN, the partially reflective element arranged between the active region and the external out-coupling reflector, the partially reflecting element having reflectivity of between about 30% and about 70% for radiation at the lasing wavelength and reflectivity of between about 30% and about 70% for radiation at the pump wavelength.

2. The structure of claim 1, wherein the PRE has reflectivity of between about 40% and about 60% for radiation at the lasing wavelength and reflectivity of between about 40% and about 60% for radiation at the pump wavelength.

3. The structure of claim 1 wherein, during operation of the VECSEL structure, the PRE is configured to provide a peak $E^2$ field in the active region that is greater than the average $E^2$ field in the substrate by a factor of more than 2.

4. The structure of claim 1 wherein, during operation of the VECSEL structure, the PRE is configured to provide a peak $E^2$ field in the active region that is greater than the average $E^2$ field in the substrate by a factor of more than 3.

5. The structure of claim 1, wherein the radiation emitted by the pump source is incident on a surface of the substrate at an angle θ such that $\sin(\theta)=n_{sub} \sin[\cos^{-1}(\lambda_{pump}/\lambda_{lase})]$ where the index of refraction of the substrate is $n_{sub}$.

6. The structure of claim 5, wherein the external out-coupling mirror, DBR, active region, and PRE are arranged so that more than about 50% of the pump radiation is absorbed in the active region.

7. The structure of claim 5, wherein the external out-coupling mirror, DBR, active region, and PRE are arranged so that more than about 75% of the pump radiation is absorbed in the active region.

8. The structure of claim 1, wherein the number of layer pairs is between about 2 and 20.

9. The structure of claim 1, wherein the number of layer pairs is between about 10 and 12.

10. The structure of claim 1, wherein a thickness of the first layer is about 50 nm and a thickness of the second layer is about 46 nm.

11. The structure of claim 1, wherein the first layer is AlGaN and the second layer is GaN and a thickness of the first layer is about $\lambda_{lase}/4n_{AlGaN}(\lambda_{lase})$ and a thickness of the second layer is about $\lambda_{lase}/4n_{GaN}(\lambda_{lase})$.

12. The structure of claim 1, wherein an antireflective coating is disposed between the substrate and the out-coupling reflector.

13. The structure of claim 12, wherein the antireflective coating has an index of refraction $n_{AR}$ and a thickness $t_{AR}$ such that $t_{AR}=(\lambda_{pump}/4n_{AR}) \cos[\sin^{-1}((1/n_{AR})\sin\theta)]$.

14. The structure of claim 1, wherein the active region comprises:
   one or more quantum well structures, each quantum well structure comprising:
      one or more $In_xGa_{1-x}N$ quantum wells, where 0.10≤x≤0.5, each quantum well having a thickness, W, and configured to emit laser radiation having a wavelength $\lambda_{lase}$.

15. The structure of claim 14, wherein:
   each quantum well structure includes two or more quantum wells with a thin GaN spacer layer having a thickness, T, disposed between each pair of quantum wells; and
   each active region element includes two or more quantum well structures with a thick GaN spacer layer having a thickness, L, where L is greater than T, disposed between each pair of quantum well structures.

16. The structure of claim 15, further comprising a GaN end spacer layer having a thickness IS, the GaN end spacer layer disposed between the PRE and one of the quantum well structures, wherein the thicknesses W, T, L, and IS are configured so that antinodes of a standing wave of the laser radiation overlap the quantum wells of the quantum well structures.

17. A surface emitting laser structure, comprising:
a first reflector;
a second reflector;
an active region comprising multiple active region elements disposed between the first reflector and the second reflector, each active region element, comprising:
one or more quantum well structures comprising one or more $In_xGa_{1-x}N$ quantum wells disposed between barrier layers, where $0.10 \leq x \leq 0.5$, the quantum wells configured to emit radiation having a wavelength, $\lambda_{lase}$; and
a pre-strain layer comprising InGaN; and
a GaN end spacer layer disposed between the second reflector and one of the quantum well structures, wherein the active region and the end spacer are configured so that the antinodes of the radiation overlap quantum well structures of the active region.

18. The structure of claim 17, wherein each active region element includes an AlGaN confinement and strain management layer.

19. The structure of claim 18, wherein:
the one or more $In_xGa_{1-x}N$ quantum wells comprise at least two $In_xGa_{1-x}N$ quantum wells and a thin GaN spacer having thickness, T, is disposed between each pair of quantum wells in each quantum well structure; and
each active region element comprises at least two quantum well structures and one or more thick GaN spacers, having thickness, L, wherein one thick GaN spacer is disposed between each pair of quantum well structures, wherein T<L.

* * * * *